United States Patent
Huang et al.

(10) Patent No.: US 7,858,466 B2
(45) Date of Patent: Dec. 28, 2010

(54) DIFFERENT-VOLTAGE DEVICE MANUFACTURED BY A CMOS COMPATIBLE PROCESS AND HIGH-VOLTAGE DEVICE USED IN THE DIFFERENT-VOLTAGE DEVICE

(75) Inventors: Chih-Feng Huang, Jhubei (TW);
Ta-yung Yang, Milpitas, CA (US);
Jenn-yu G. Lin, Taipei (TW); Tuo-Hsin Chien, Tucheng (TW)

(73) Assignee: System General Corp., Taipei Hsien (TW)

( * ) Notice: Subject to any disclaimer, the term of this patent is extended or adjusted under 35 U.S.C. 154(b) by 0 days.

(21) Appl. No.: 11/682,621

(22) Filed: Mar. 6, 2007

(65) Prior Publication Data
US 2007/0178648 A1 Aug. 2, 2007

Related U.S. Application Data

(63) Continuation of application No. 10/914,943, filed on Aug. 9, 2004, now Pat. No. 7,205,201.

(51) Int. Cl.
*H01L 21/8238* (2006.01)
(52) U.S. Cl. .................. 438/220; 438/439; 438/200
(58) Field of Classification Search .......... 438/200, 438/220, 439; 257/500
See application file for complete search history.

(56) References Cited

U.S. PATENT DOCUMENTS

| 4,874,714 A * | 10/1989 | Eklund ................ 438/200 |
| 5,917,222 A * | 6/1999 | Smayling et al. .......... 257/370 |
| 6,165,846 A * | 12/2000 | Carns et al. ............ 438/264 |
| 2004/0171197 A1* | 9/2004 | Park .................. 438/142 |
| 2005/0048723 A1* | 3/2005 | Lee et al. ............. 438/275 |

* cited by examiner

*Primary Examiner*—Bradley K Smith
(74) *Attorney, Agent, or Firm*—J.C. Patents

(57) ABSTRACT

A method of manufacturing different-voltage devices mainly comprises forming at least one high-voltage well in high-voltage device regions, at least one N-well in low-voltage device regions, at least one P-well in low-voltage device regions, source/drain wells in high-voltage device regions, and isolation wells in isolation regions in a p-type substrate. The breakdown voltage is adjusted by modulating the ion doping profile. Furthermore, parameters of implanting conductive ions are adjusted for implanting conductive ions into both high-voltage device regions and low-voltage device regions. The isolation wells formed in isolation regions between devices are for separating device formed over high-voltage device regions and device formed over low-voltage device regions. The thickness of a HV gate oxide layer is thicker than the thickness of an LV gate oxide layer for modulating threshold voltages of high-voltage devices and low-voltage devices.

3 Claims, 7 Drawing Sheets

US 7,858,466 B2

DIFFERENT-VOLTAGE DEVICE MANUFACTURED BY A CMOS COMPATIBLE PROCESS AND HIGH-VOLTAGE DEVICE USED IN THE DIFFERENT-VOLTAGE DEVICE

CROSS-REFERENCE TO RELATED APPLICATION

This is a continuation application of patent application Ser. No. 10/914,943, filed on Aug. 9, 2004, which is now allowed. The entirety of the above-mentioned patent application is hereby incorporated by reference herein and made a part of this specification.

BACKGROUND OF THE INVENTION

1. Field of the Invention

The present invention relates to a method of manufacturing semiconductor device, and more particularly to a method of manufacturing different-voltage semiconductor devices.

1. Description of Related Art

The single chip process for integrating power switches with control circuitry is a major trend in the field of power IC development. Its objective is to integrate high-voltage devices and low-voltage devices in a single process for reducing the manufacturing cost and increasing industrial utilization. However, in traditional applications the process is complicated and the disturbance between high-voltage devices and low-voltage devices is unavoidable. Meanwhile, since electronic characteristics of high-voltage devices and low-voltage devices are different, e.g. threshold voltage, there exist lots of difficulties in circuit design. Traditional processes usually have their own structures or procedures particularly for high-voltage transistor, but those structures or procedures would reduce utilization and increase the manufacturing cost.

Therefore, a method for manufacturing different-voltage devices in a single process while compatible with a standard process is desired.

SUMMARY OF THE INVENTION

The present invention relates to a method of manufacturing different-voltage devices in a single process. The method of the present invention is compatible with a standard CMOS process to enhance industrial applications. The method only requires two additional masks in a standard CMOS process, namely a HV (high voltage) well mask and a HV gate oxide mask. The method of the present invention is capable of integrating different-voltage devices, such as low-voltage devices and high-voltage devices. Each device is isolated from other devices, and the threshold voltage of high-voltage devices can be controlled to be close to that of low-voltage devices. This can reduce the disturbance between different-voltage devices.

The present invention relates to a different-voltage device, which is compatible with a CMOS process. The different-voltage device comprises a high-voltage device and a low-voltage device. The high-voltage device is manufactured with a low-voltage device process, and a plurality of additional masks are further added to manufacture the high-voltage device, and a low-voltage gate oxide layer is disposed directly on a high-voltage gate oxide layer in the high voltage device.

The depth of a high-voltage well of the high-voltage device is deeper than the depth of a low-voltage well of the low-voltage device.

The present invention relates to a high-voltage device used in a different-voltage device which is compatible with a CMOS process. A high-voltage device is manufactured with a process of a low-voltage device, and a plurality of additional masks are further added to manufacture the high-voltage device, and a low-voltage gate oxide layer is disposed directly on a high-voltage gate oxide layer in the high voltage device. The depth of a high-voltage well of the high-voltage device is deeper than the depth of a low-voltage well of the low-voltage device.

The method according to an embodiment of the present invention is described as follows. Firstly, HVNW (high-voltage N-well) regions are defined and formed in the semiconductor substrate. This is where the first additional mask is added. Next, a HV gate oxide is formed before forming a LV (low-voltage) gate oxide. This is where the second additional mask is added. The sequence of other steps of the process is identical as a standard CMOS process.

These and other objectives, features and advantages of the present invention will become apparent to those skilled in the art upon consideration of the following description of the preferred embodiments of the present invention taken in conjunction with the accompanying drawings.

DETAILED DESCRIPTION OF THE INVENTION

Figure 1:
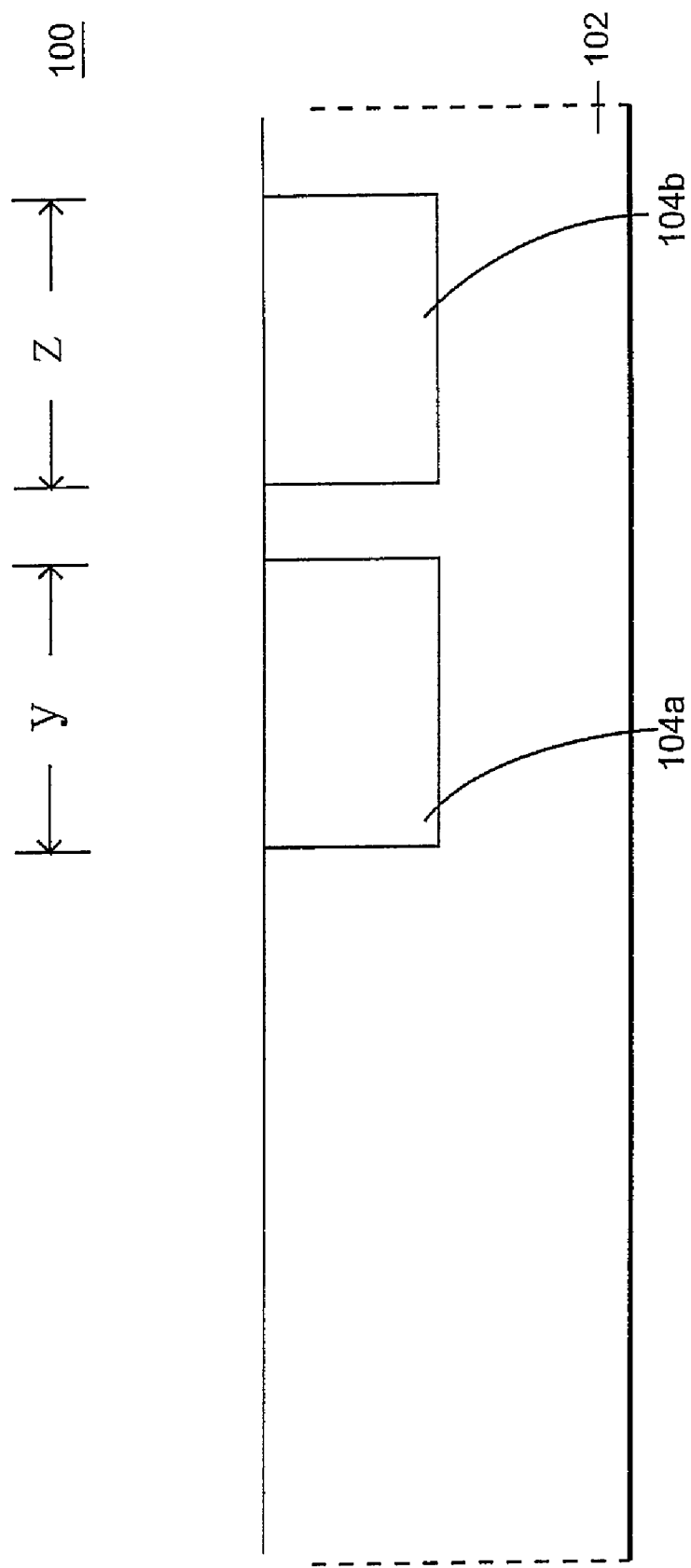
FIGS. 1-7 illustrates cross-sectional views showing the progressive process steps of manufacturing different-voltage devices compatible with standard CMOS processes according to an embodiment of the present invention.

Referring to FIG. 1, a substrate 102 e.g. a p-type doping layer is provided. Next, HVNW (high-voltage N-well) 104a, 104b are formed in the substrate 102 for forming a high-voltage NMOS and a high-voltage PMOS respectively. It should be noted that a first additional mask is required for forming the HVNW 104a and the HVNW 104b. A region z defines a high-voltage PMOS region while a region y defines a high-voltage NMOS region.

Figure 2:
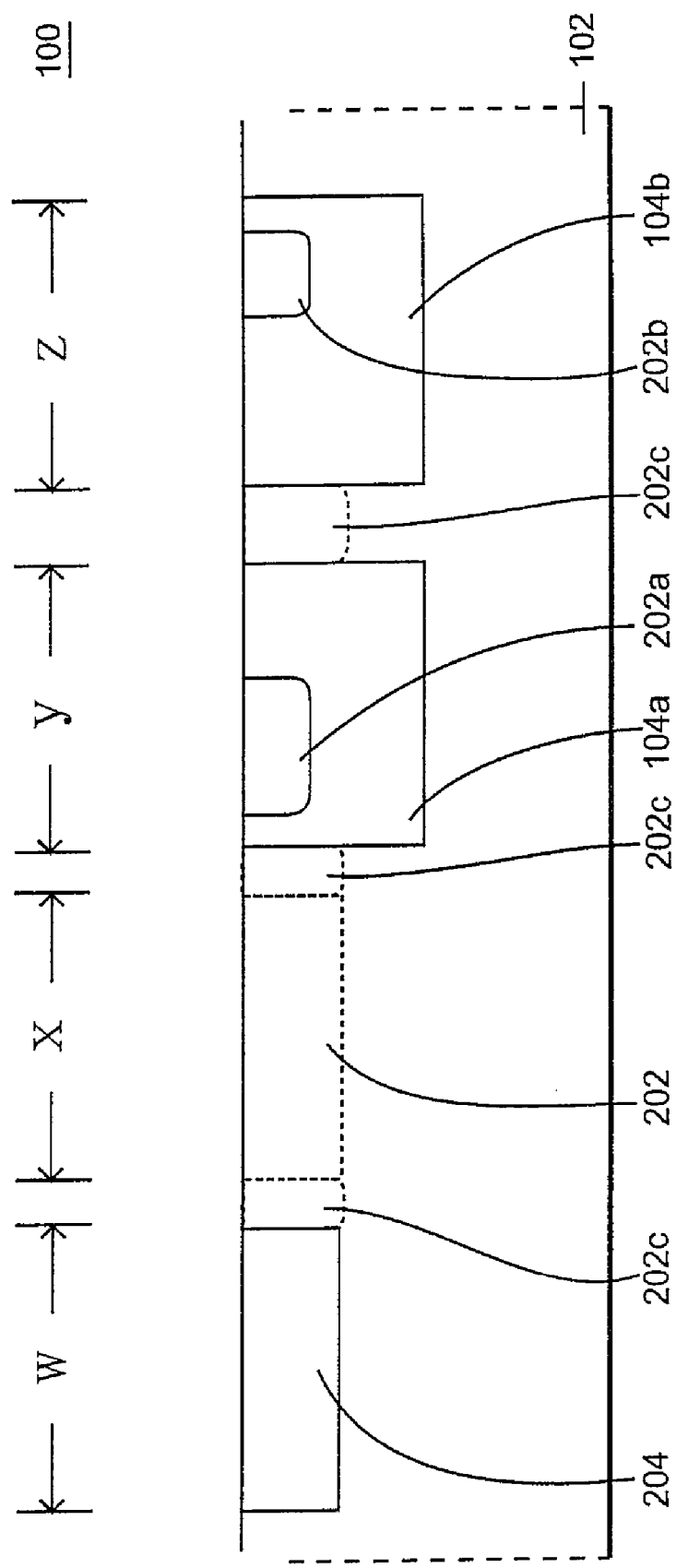

Referring to FIG. 2, an N-well. (NW) 204, a P-well (PW) 202, a PW 202a, a PW 202b and PW 202c are formed in the substrate 102. The NW 204, e.g. an n-type doping well, is for forming a low-voltage PMOS. The PW202, e.g. a p-type doping well, is for forming a low-voltage NMOS. The PW 202a formed in the high-voltage NMOS is for forming a part of a source region of the high-voltage NMOS. The PW 202b formed in the high-voltage PMOS is for forming a part of a drain region of the high-voltage PMOS. The PW 202c is for forming an isolation structure. A region x defines a low-voltage NMOS region while a region w defines a low-voltage PMOS region. By adjusting ion implantation parameter, the P-well can be formed according to desired requirement. This can greatly reduce the overall manufacture cost. Furthermore, the aforementioned process is compatible with a standard CMOS process.

Figure 3:
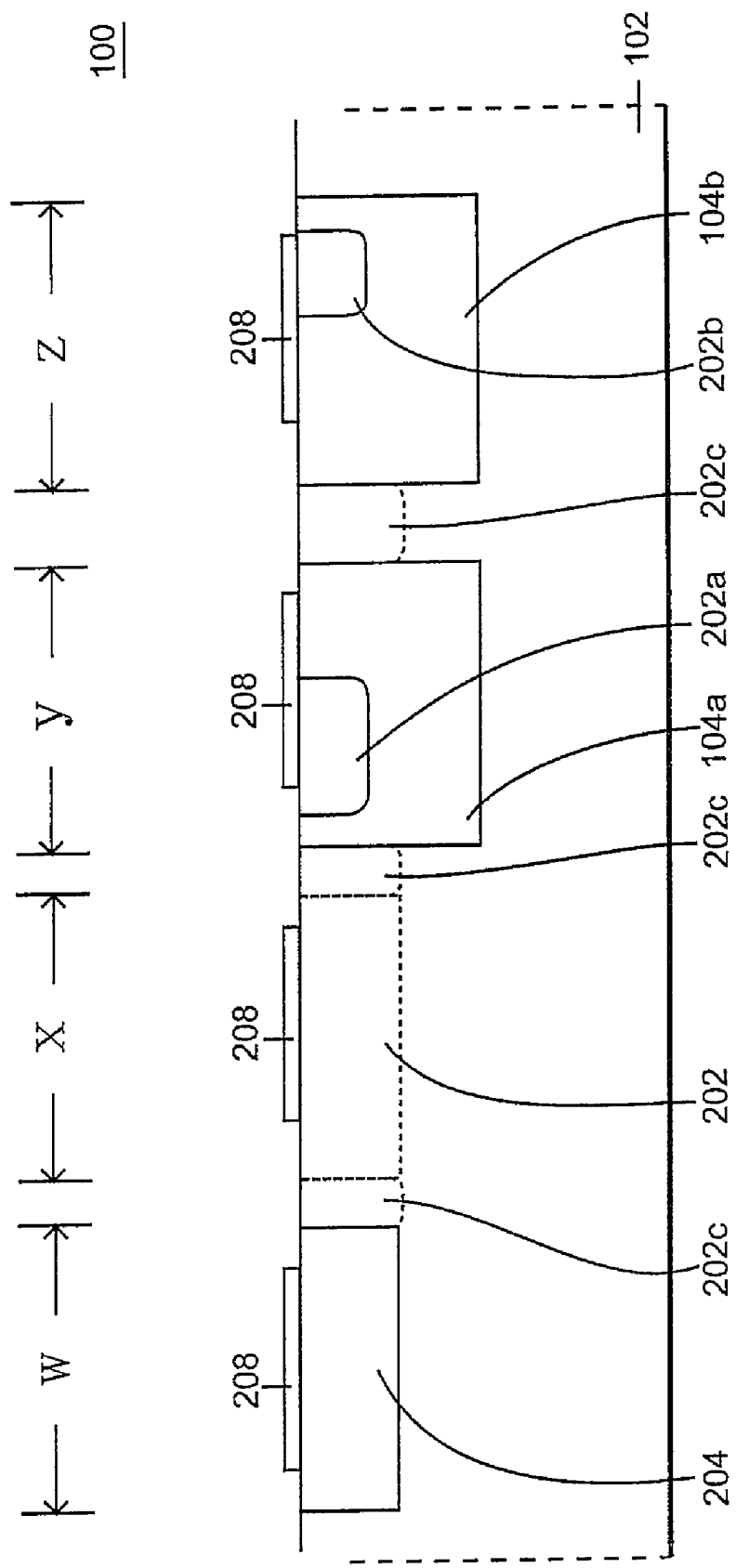

Referring to FIG. 3, a patterned nitride layer 208 is formed over the substrate 102 covering areas of the substrate where field oxidation is not desired.

Figure 4:
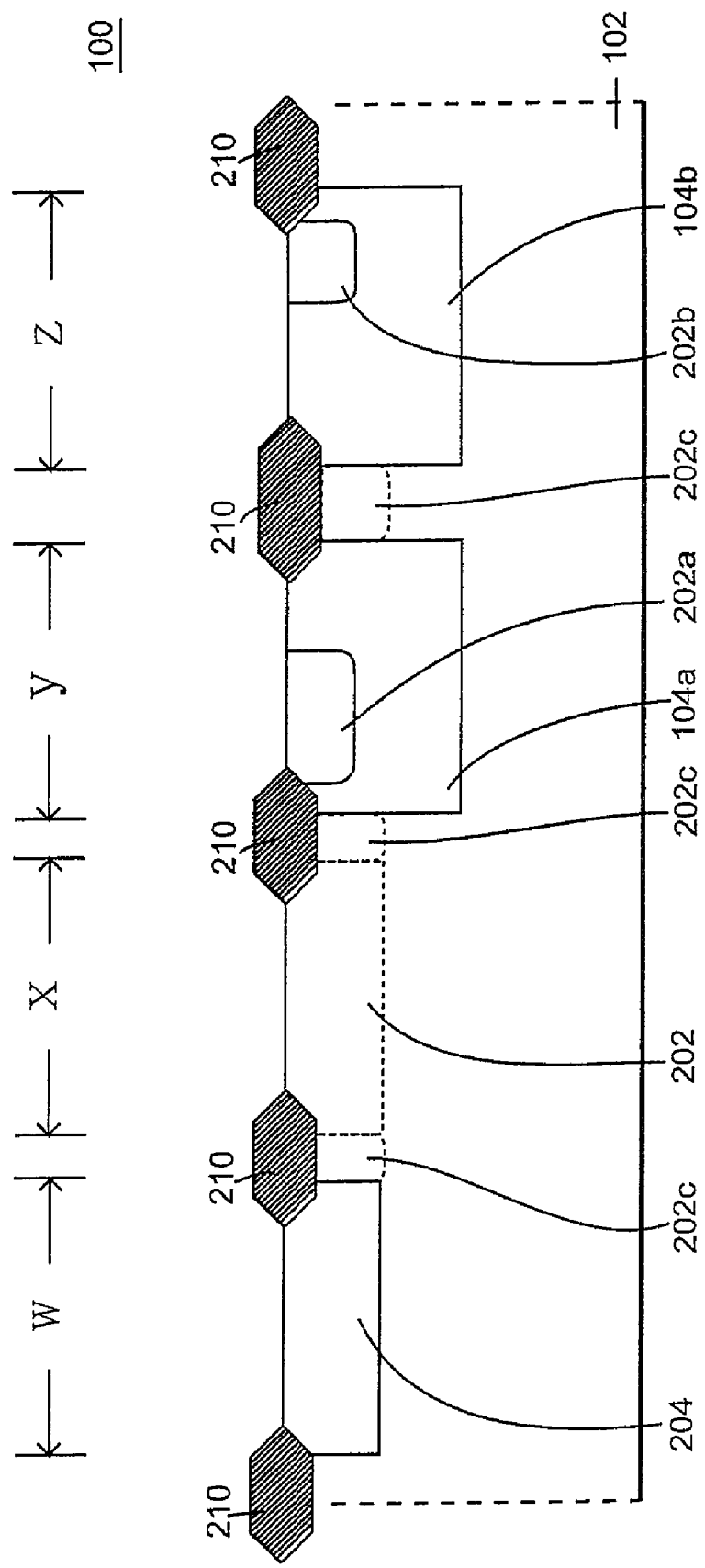

Referring to FIG. 4, field oxidation is carried out to form a field oxide 210 in the exposed areas of the substrate 102 for isolating the low-voltage NMOS, the low-voltage PMOS, the high-voltage PMOS, and the high-voltage NMOS. Subsequently, the nitride layer 208 is removed.

Figure 5:
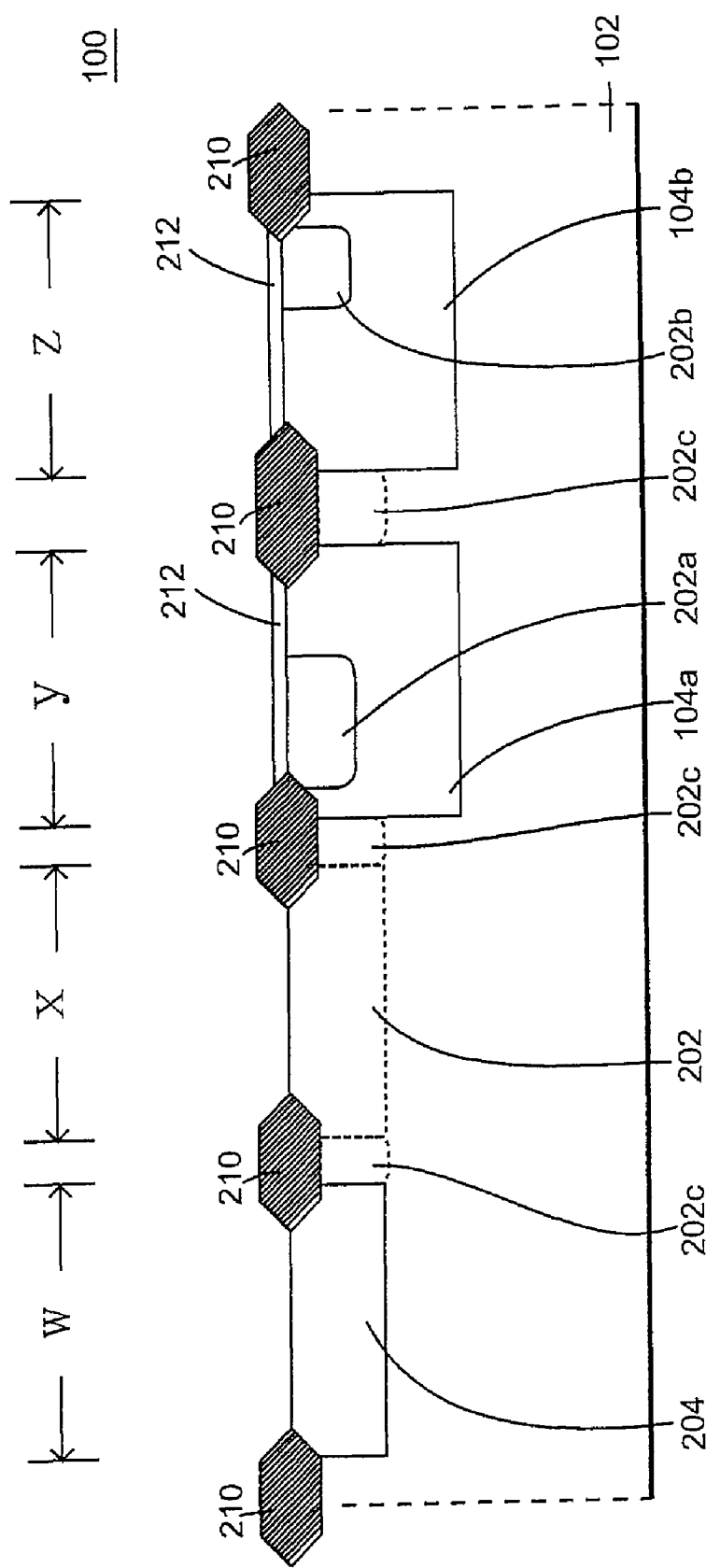

Referring to FIG. 5, a HV (high-voltage) gate oxide layer 212, e.g. $SiO_2$, is formed over the surface of the high-voltage NMOS and the high-voltage PMOS. It should be noted that a second additional mask is required for forming the HV gate oxide layer 212. By modulating the doping profile of N-well/

P-well and fabrication step of the HV gate oxide layer 212, the threshold voltage of high-voltage devices and low-voltage devices an be modulated to achieve desired characteristics.

Figure 6:
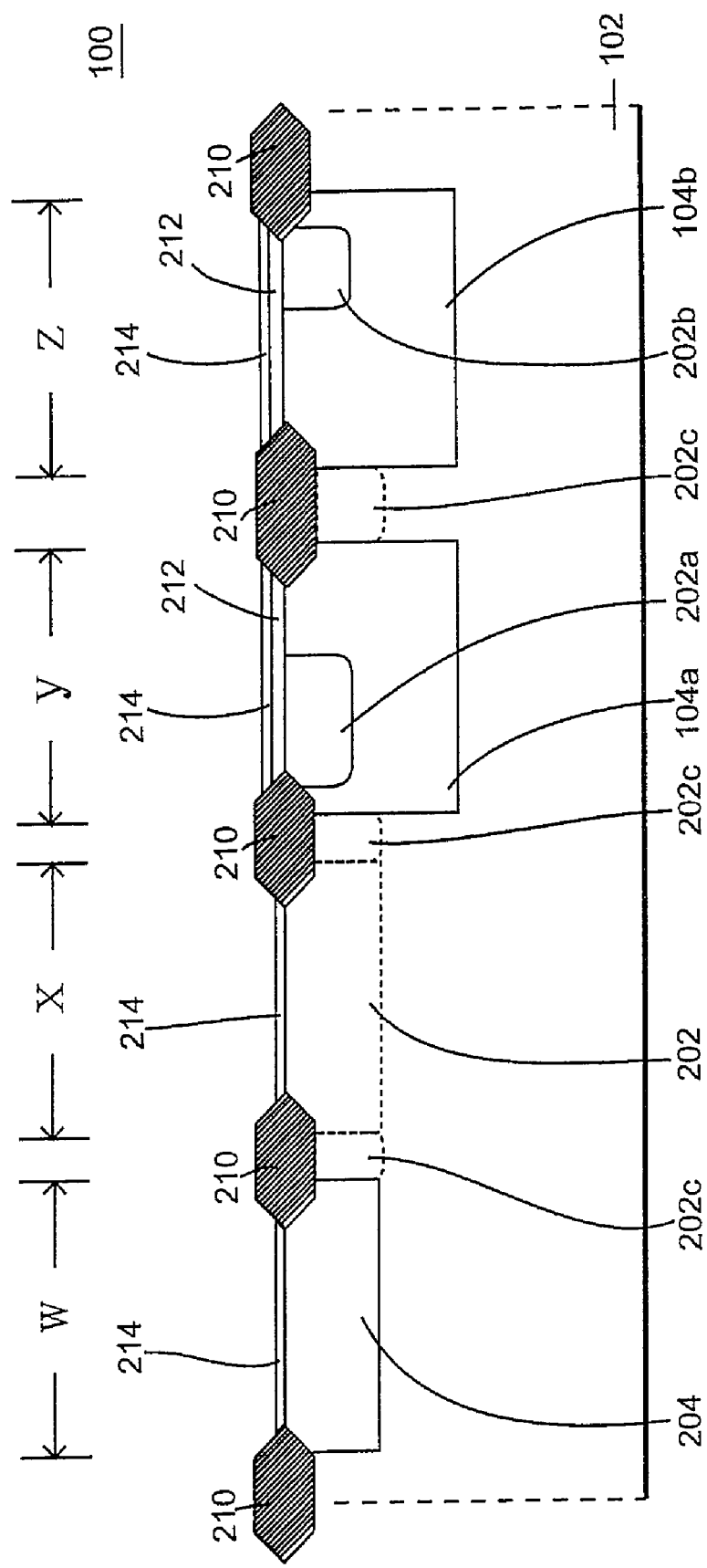

Referring to FIG. 6, a standard CMOS process is carried out to form a low-voltage (LV) gate oxide layer 214 over the surface of the low-voltage NMOS, the low-voltage PMOS, the high-voltage NMOS, and the high-voltage PMOS. The electrical characteristics of high-voltage devices and low-voltage devices are different. The HV gate oxide layer 212 is applied in high-voltage devices. The LV gate oxide layer 214 is applied in low-voltage devices. It should be noted that, it is preferable that the HV gate oxide layer 212 is prior to forming the LV gate oxide layer 214 in order not to adversely affect the formation of LV gate oxide layer 214. The formation of the LV gate oxide layer 214 does not require an additional mask.

Figure 7:
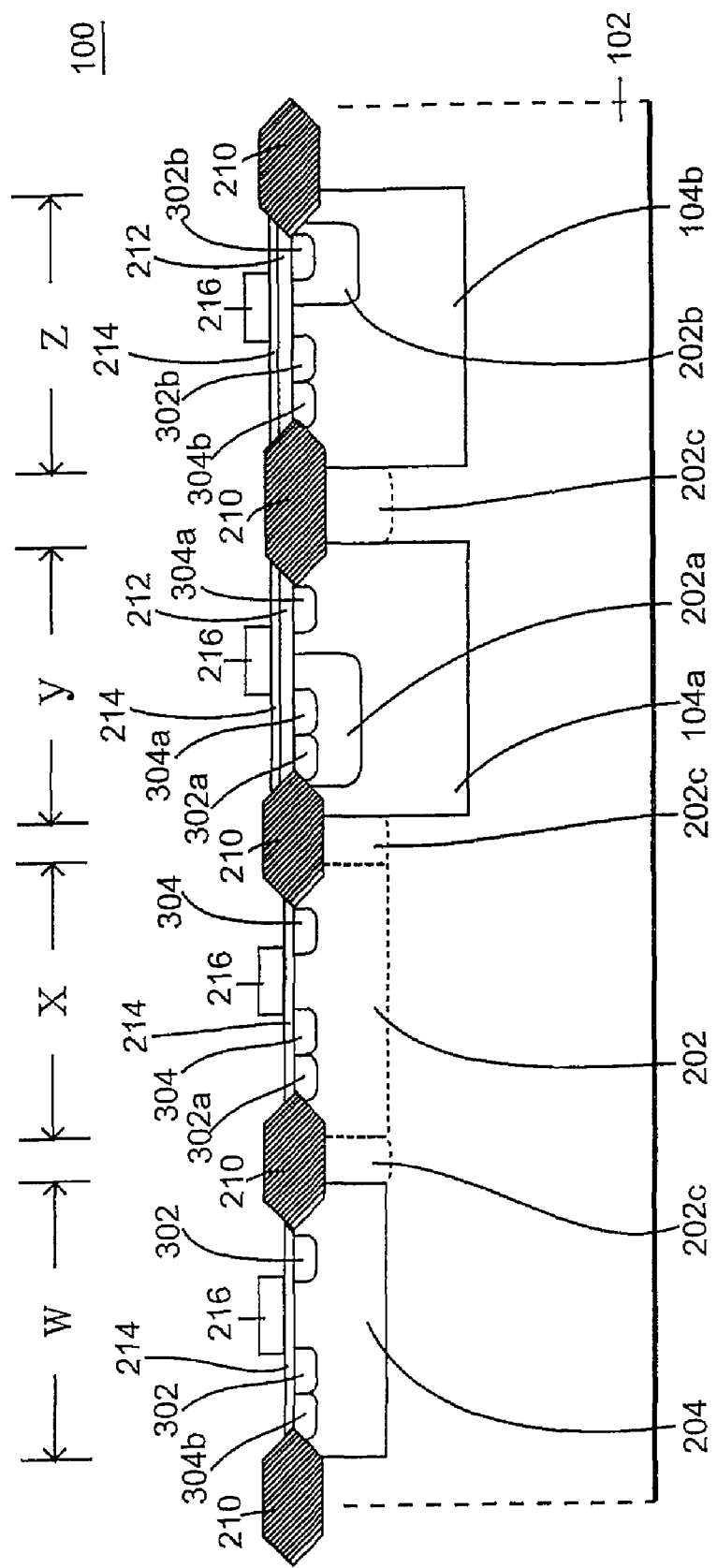

As shown in FIG. 7, a patterned poly layer 216 is formed over the HV gate oxide layer 212 and the LV gate oxide layer 214. Thereafter, NSD (N+ Source/Drain) regions 304, 304a, 304b, and PSD (P+ Source/Drain) regions 302, 302a, 302b are formed. The NSD regions contain N+ conductive ions, and the PSD regions contain P+ conductive ions. The NSD region 304 serves as the drain/source of the low-voltage NMOS. The NSD region 304a serves as the drain/source of the high-voltage NMOS, and the NSD 304b region serves as the body contact of the high-voltage PMOS and the low-voltage PMOS. The PSD region 302 serves as the drain/source of the low-voltage PMOS. The PSD region 302b serves as the drain/source of the high-voltage PMOS. The NSD region 302a serves as the body contact of the high-voltage NMOS and the low-voltage NMOS.

In the present embodiment of the present invention, the CMOS compatible process of manufacturing and integrating different-voltage devices including a HVNW and a HV gate oxide layer requires two additional masks. A high-voltage MOS, for example, can bear a voltage more than 30V, and the threshold voltage of the high-voltage MOS and a low-voltage MOS can be controlled to achieve required value. Since the process of the present invention is compatible with a standard CMOS process, the existing CMOS manufacture facility may be utilized without incurring additional capital investment on hardware or software. Thereby the overall lead-time and manufacture cost for manufacturing the different-voltage devices can be reduced. Accordingly, this process is a very unique process, particularly in a semiconductor industry, for integrating high-voltage MOS and low-voltage MOS.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A different-voltage device, manufactured by a process compatible with a CMOS process, the different-voltage device comprising:
a high-voltage device in a high-voltage region and a low-voltage device in a low-voltage region, wherein the high-voltage device is manufactured with a low-voltage device process, and two additional masks are further added to manufacture the high-voltage device, and a low-voltage gate oxide layer is disposed directly on a high-voltage gate oxide layer in the high voltage region and on a surface of a substrate in the low-voltage region, wherein the low-voltage gate oxide layer provided on the high-voltage gate oxide layer together with the high-voltage gate oxide layer thereunder serve as a high-voltage gate oxide member of the high-voltage device, and the low-voltage gate oxide layer provided on the surface of the low-voltage device serves as a low-voltage gate oxide member of the low-voltage device, wherein the high-voltage gate oxide member of the high-voltage device has a height higher than the low-voltage gate oxide member of the low-voltage device, wherein the depth of a high-voltage well of the high-voltage device is deeper than the depth of a low-voltage well of the low-voltage device, wherein the high-voltage gate oxide layer in the high-voltage region is higher than the surface of the substrate in the low-voltage region, and wherein the high-voltage region and the low-voltage region are isolated by a field oxide and an isolation well thereunder, and the isolation well is directly connected between the high-voltage well of the high-voltage device and the low-voltage well of the low-voltage device, types of the low-voltage well and the high-voltage well are complementary.

2. The different-voltage device as claimed in claim 1, wherein the high-voltage device and the low-voltage device are isolated from each other.

3. A high-voltage device used in a different-voltage device which is manufactured by a process compatible with a CMOS process, wherein a high-voltage device is manufactured with a process of a low-voltage device, two additional masks are further added to manufacture the high-voltage device, and a low-voltage gate oxide layer is disposed directly on a high-voltage gate oxide layer in a high voltage region and on a surface of a substrate in a low-voltage region, wherein the low-voltage gate oxide layer provided on the high-voltage gate oxide layer together with the high-voltage gate oxide layer thereunder serve as a high-voltage gate oxide member of the high-voltage device, and the low-voltage gate oxide layer provided on the surface of the low-voltage device serves as a low-voltage gate oxide member of the low-voltage device, wherein the high-voltage gate oxide member of the high-voltage device has a height higher than the low-voltage gate oxide member of the low-voltage device, wherein the depth of a high-voltage well of the high voltage device is deeper than the depth of a low-voltage well of the low-voltage device, wherein the high-voltage gate oxide layer in the high-voltage region is higher than the surface of the substrate in the low-voltage region, and wherein the high-voltage region and the low-voltage region are isolated by a field oxide and an isolation well thereunder, and the isolation well is directly connected between the high-voltage well of the high-voltage device and the low-voltage well of the low-voltage device, types of the low-voltage well and the high-voltage well are complementary.

* * * * *